(12) United States Patent  
Boerner (10) Patent No.: US 8,653,544 B2  
(45) Date of Patent: Feb. 18, 2014

(54) OLEDS CONNECTED IN SERIES

(75) Inventor: Herbert Friedrich Boerner, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 190 days.

(21) Appl. No.: 13/254,561

(22) PCT Filed: Feb. 25, 2010

(86) PCT No.: PCT/IB2010/050825  
§ 371 (c)(1), (2), (4) Date: Sep. 2, 2011

(87) PCT Pub. No.: WO2010/100584  
PCT Pub. Date: Sep. 10, 2010

(65) Prior Publication Data  
US 2011/0316013 A1     Dec. 29, 2011

(30) Foreign Application Priority Data  
Mar. 5, 2009   (EP) ...................................... 09154374

(51) Int. Cl.  
*H01L 29/18*     (2006.01)

(52) U.S. Cl.  
USPC .................. 257/88; 257/E39.007; 438/34

(58) Field of Classification Search  
USPC .............. 257/40, 88, 103, E31.123, E39.007; 438/22, 34, 24, 27–29  
See application file for complete search history.

(56) References Cited

U.S. PATENT DOCUMENTS

| | | | |
|---|---|---|---|
| 5,302,468 A | 4/1994 | Namiki et al. | |
| 7,213,942 B2 * | 5/2007 | Jiang et al. | 362/231 |
| 7,510,885 B2 * | 3/2009 | Halls et al. | 438/22 |
| 2005/0073251 A1 | 4/2005 | Kato | |
| 2005/0111211 A1 | 5/2005 | Takeuchi | |
| 2007/0190234 A1 | 8/2007 | Griffin et al. | |
| 2008/0265759 A1 | 10/2008 | Young et al. | |

FOREIGN PATENT DOCUMENTS

| | | |
|---|---|---|
| EP | 1895608 A2 | 3/2008 |
| JP | 2006164618 A | 6/2006 |

* cited by examiner

Primary Examiner — David Vu (57) ABSTRACT

OLED device (1) comprising a substrate (4) with multiple light emitting OLED segments (5, 6, 7) on top of the substrate (4) each comprising an electroluminescent layer stack (6) of at least an organic light-emitting layer sandwiched between a substrate electrode (5) facing towards the substrate (4) and a counter electrode (7), which are connected in series and are separated from the adjacent OLED segment (5, 6, 7) by an interconnect region (3) located between the adjacent OLED segments comprising a first isolating layer (10) of an electrically non-conducting material between the substrate electrodes (5) of adjacent OLED segments to electrically isolate the adjacent substrate electrodes (5) from each other and a conductive layer (9) of an electrically conducting material to connect the counter electrode (7) of the OLED segment to the substrate electrode (5) of the adjacent OLED segment, wherein the electrically non-conducting material and/or the conducting material is suitable to redirect the light emitted by the adjacent OLED segments out of the substrate (4) to emit light (81) from the interconnect regions (3).

13 Claims, 5 Drawing Sheets

OLEDS CONNECTED IN SERIES

FIELDS OF THE INVENTION

The invention relates to OLED devices with segmented OLEDs connected in series on a substrate without non-emissive gaps between the segments and to a method to manufacture such OLED devices.

BACKGROUND OF THE INVENTION

Organic light emitting devices (OLEDs) are large area light sources operated at low voltages of typically 2-5V. OLEDs with large emitting areas require high currents of typically >10 A/m2. To reduce the current requirements one preferred solution is the serial connection of OLEDs on a substrate, where the current passes through the OLEDs connected in series. These serial OLEDs need a smaller current, but a multiple driving voltage. Such large area light sources made of connected OLEDs on a substrate have the disadvantage of gaps between the connected OLEDs where no electroluminescent layer is present. Consequently the gaps are not light emitting and are therefore visible as black lines.

Document US 20050111211A1 discloses a lighting unit with a plurality of separate organic electroluminescent elements each comprising a transparent substrate connected in series. To form a large area light source the side faces (end faces) of the substrates of the electroluminescent element are glued together with an adhesive. Subsequently there is a gap between the electroluminescent elements, where no electroluminescent light is generated. Such a gap would be visible to the outside as a black area. To avoid such black areas US 20050111211A1 applies a light-scattering adhesive for joining the adjacent electroluminescent elements to emit a part of the electroluminescent light from the adhesive to the outside of the light emitting unit. Therefore the appearance of black areas is at least reduced. The disadvantage of this lighting unit is the required high effort to align and glue together the electroluminescent elements to form a large area light source. Furthermore, the structuring of both electrodes of each electroluminescent unit to enable an electrical series connection of said elements require a multiple masks process applying different masks. The final electrical series connection can only be established after gluing the elements together, which is an additional process step requiring additional effort.

SUMMARY OF THE INVENTION

It is an object of the present invention to provide an OLED device with segmented OLEDs connected in series without black lines in between and being easy to manufacture and a corresponding method to manufacture such an OLED device.

This object is solved by an OLED device comprising a substrate with multiple light emitting OLED segments on top of the substrate each comprising an electroluminescent layer stack of at least one organic light-emitting layer sandwiched between a substrate electrode facing towards the substrate and a counter electrode, which are connected in series and are separated from the adjacent OLED segment by an interconnect region located between the adjacent OLED segments comprising a first isolating layer of an electrically non-conducting material between the substrate electrodes of adjacent OLED segments to electrically isolate the adjacent substrate electrodes from each other and a conductive layer of an electrically conducting material to connect the counter electrode of the OLED segment to the substrate electrode of the adjacent OLED segment, wherein the electrically non-conducting material and/or the conducting material is suitable to redirect the light emitted by the adjacent OLED segments out of the substrate to emit light from the interconnect regions into the environment.

The leading idea of the present invention is to avoid black lines in the appearance of a serial connected OLED devices by using suitable materials in the interconnect region combining suitable electrical and optical properties. The light emission within the organic electroluminescent layer is isotropic. The light with a propagation direction essentially perpendicular to the substrate surface will leave the substrate to the environment. However the refractive index of the substrate is commonly much higher than the refractive index of the environment (e.g. air with a refractive index of 1) leading to a significant amount of light not leaving the substrate of the OLED device. Subsequently the light trapped within the substrate propagates to the area above the interconnect regions between the OLED segments. With conducting and non-conducting materials at the interconnect regions having suitable optical properties to redirect the trapped light towards the substrate surface a light emission from the interconnect region to the environment is achieved, preferably leading to a homogeneous brightness of the complete light emitting area of the OLED device. For example the non-conducting and conducting material is called suitable if the optical properties such as light reflection properties, light scattering properties, refractive indices and/or adapted geometrical shapes of the corresponding layers comprising the first isolation layer and/or the conductive layer exhibit the desired effect to redirect light towards the substrate surface under such an angle of incidence suitable to couple out the re-directed light. A suitable choice of materials and layer geometry enabling alternative manufacturing steps simultaneously leads to less complex and/or less expensive manufacturing process. The brightness of the interconnect region increases, if the light redirection effect is increased. To achieve an essentially homogeneous brightness appearance of the OLED devices, the size of the interconnect region can be larger, if its brightness is identical to the brightness of the OLED segments. An acceptable larger size of the interconnect region will further reduce the manufacturing effort, because less complex coating processes can be applied, preferably some of the coating processes can be executed without a shadow mask.

In the context of the invention the notion substrate denotes a base material onto which the different layers of an electroluminescent device are deposited. Normally, the substrate is transparent and is made of glass. Furthermore, it may be preferable that the substrate is transparent, preferably comprising at least one of the following materials: silver, gold, glass or ceramics. It may also be a transparent polymer sheet or foil with a suitable moisture and oxygen barrier to essentially prevent moisture and/or oxygen entering the electroluminescent device layer stack. It is also possible to use non-transparent materials like metal foils as substrate. The substrate may comprise further layers, e.g. for optical purposes like light out-coupling enhancement or other purposes. The substrate is usually flat, but it may also be shaped into any three-dimensional shape that is desired. Common substrates have refractive indices between 1.3 and 1.6.

In the context of this invention the notation OLED segments denotes OLED units, which comprise all layer required to show electroluminescent light emission. The OLED segments may have any shape within the scope of this invention. As an example, the OLED segments may have a stripe-like shape arranged as a sequence of parallel stripes on top of the substrate.

The notation on-top-of denotes the sequence of the listed layers. This notation explicitly comprises the possibility of further layers in between the layer denoted as on top of each other. For example, there might be additional optical layers to enhance the light out-coupling arranged between substrate and the substrate electrode on top of the substrate.

In the context of the invention the notion electroluminescent (EL) layer stack denotes all layers prepared between the substrate and counter electrodes. In one embodiment of the EL layer stack, it comprises at least one light emitting organic electroluminescent layer prepared between substrate and counter electrode. In other embodiments the layer stacks may comprise several layers prepared between substrate and counter electrode. The several layers may be organic layers, such as one or more hole transport layers, electron blocking layers, electron transport layers, hole blocking layers, light emitting layers or a combination of organic and non-organic layers. The non-organic layers may be additional electrodes in case of two or more light emitting layers within the layer stack and/or charge injection layers. In a preferred embodiment the substrate electrode and or the counter electrode comprise at least one of the following materials: ITO, aluminum, silver, doped ZnO, or an oxide layer.

In the context of the invention the notion substrate electrode denotes an electrode deposited on top of the substrate. Usually it consists of transparent ITO (Indium-Tin oxide) optionally with an undercoating of $SiO_2$ or SiO to suppress diffusion of mobile atoms or ions from the glass into the electrode. For a glass substrate with an ITO electrode, the ITO is usually the anode, but in special cases it can also be used as the cathode. In some cases, thin Ag or Au layers (8-15 nm thick) are used single or in combination with ITO as the substrate electrode. If a metal foil is used as the substrate, it takes also the role of the substrate electrode, either anode or cathode. The use of a single substrate for the multiple light-emitting OLED segments prevents any further mounting steps to obtain a large area light source, such as gluing OLED tiles together, compared to prior art.

In the context of the invention the notion counter electrode denotes an electrode away from the substrate. It is usually non-transparent and made of Al or Ag layers of sufficient thickness such that the electrode is reflecting (typically 100 nm for Al and 100-200 nm for Ag). It is usually the cathode, but it can also be biased as the anode. For top-emitting or transparent electroluminescent devices the counter electrode has to be transparent. Transparent counter electrodes are made of thin Ag or Al layers (5-15 nm) or of ITO layers deposited on top of the other previously deposited layers.

In the context of the invention an electroluminescent device with a combination of a transparent substrate, a transparent substrate electrode and a non-transparent counter electrode (usually reflective), emitting the light through the substrate is called "bottom-emitting". In case of an electroluminescent device comprising further electrodes, in certain embodiments both substrate and counter electrodes could be either both anodes or both cathodes, when the inner electrodes as driven as cathodes or anodes. Furthermore, in the context of the invention an electroluminescent device with a combination of a non-transparent substrate electrode and a transparent counter electrode, emitting the light through the counter electrode is called "top-emitting".

In the context of the invention the notion transparent electroluminescent device denotes an electroluminescent device, where the substrate, the substrate electrode, the counter electrode and the encapsulation means are transparent. Here the electroluminescent device is both, bottom and top-emitting. In the context of the invention a layer, substrate or electrode is called transparent if the transmission of light in the visible range is more than 50%; the rest being absorbed or reflected. Furthermore, in the context of the invention a layer, substrate or electrode is called semi-transparent if the transmission of light in the visible range is between 10% and 50%; the rest being absorbed or reflected. In addition, in the context of the invention light is called visible light, when it possesses a wavelength between 450 nm and 650 nm. In the context of the invention light is called artificial light, when it is emitted by the organic electroluminescent layer of the electroluminescent device.

In the context of the invention a layer, substrate, electrode or a construction element of the OLED device is called reflective if light incident on its interface is returned according to the law of reflection: the macroscopic angle of incidence equals the macroscopic angle of reflection. Also the term specular reflection is also used in this case. Furthermore, in the context of the invention a layer, substrate, electrode or a construction element of the OLED device is called scattering if light incident on it is not returned according to the law of reflection: macroscopic angle of incidence is not equal to the macroscopic angle of the returned light. There is also a distribution of angles for the returned light. Instead of scattering, the term diffuse reflection is also used.

Furthermore, in the context of the invention a layer or the material of a layer is denoted as conducting if its electrical resistance is less than 100000 Ohm. Subsequently, a layer or the material of the layer is called non-conducting (or isolating), if its resistance is larger than 100000 Ohm. The materials used for the first isolation and conductive layers should not harm the substrate electrode, the organic electroluminescent layer and the counter electrode. The conductive layer may comprise any suitable conducting material within the scope of this invention, as an example metals such as Al, Ag, etc. People skilled in the art may choose other conducting materials within the scope of this invention.

In an embodiment the electrically conducting material of the conducting layer comprises at least one material of the group of materials of glue, lacquer or ink, preferably comprising light scattering particles, more preferred electrically conducting light scattering particles. These materials can be applied in a gentle manner between substrate electrode and counter electrode due to their viscous form, so that it can be applied for instance with simple printing or spraying processes to the interconnect region. The conductivity of the conducting layer can be changed in a wide range by using different conductive filling materials such as light scattering particles. Typical values of the volume resistivity of conductive glues are e.g. $<10^{-3}$ Ohm cm for silver particles, 5-10 Ohm cm for nickel particles and 50-100 Ohm cm for graphite particles. In a preferred embodiment these materials are anhydrous and/or water free. In the context of the invention, the notion water free and/or anhydrous describes the fact, that no degradation due to water content during the average lifetime of an electroluminescent device can be observed by the naked eye. A visible degradation of the organic electroluminescent layer due to water diffusing into the layer stack can take the form of growing black spots or shrinkage of the emissive region from the edges. The notion water free and/or anhydrous not only depends on the content of conductive layer itself but also on the amount of water, which can be absorbed by the organic electroluminescent layer without damaging it. In a further preferred embodiment the OLED device may comprise moisture and/or oxygen barriers. In the context of the invention layers preventing harmful diffusion of moisture and/or oxygen into the electroluminescent layer stack are called moisture and/or oxygen barriers. A diffusion is denoted as harmful if a significant life-time reduction of the OLED device can be observed. Standard OLED devices according to state of the art achieve shelf life times in the order of 100000 hours or more. A significant reduction denotes a reduced life-time of about a factor of 2 or more.

The conductive glue, lacquer or ink comprise a matrix and filler (organic and/or inorganic material). Preferably, the conductive glue, lacquer or ink, comprise organic materials as the matrix comprising at least one of the following matrices: epoxies, polyurethanes or silicones and inorganic materials as the filler. The filler and/or the matrix have to be conductive to conduct the electrical current from the counter electrode of one OLED segment to the substrate electrode adjacent OLED segment (or vice versa). Therefore, it is preferred, that the conductive material, e.g. the matrix and/or filler, comprises conductive flakes or particles. This conductive flakes or particles are needed for conductivity. They must possess low resistance, stability and durability. Therefore, it is preferred that the material of the flakes and/or particles are at least one material of the group Silver, Gold, Nickel, Platinum, Copper, Palladium or other metals or other nonmetals like Carbon, glassy Carbon, Graphite, Carbon nanotubes, doped ZnO, SnO, electrically conductive nitrides, electrically conductive borides, metal covered glass or plastic beads, metal covered glass or plastic hollow beads or metal or graphite particles covered with copper or silver or combinations thereof. Depending on the optical properties such as reflectivity of the conducting flakes and/or particles, these flakes and/or particles are either light scattering or not light scattering. If the isolation layer does not redirect the electroluminescent light out of the substrate, the conductive layer has to comprise scattering flakes and/or particles.

In another embodiment the first isolation layer may comprise any suitable non-conducting material such as $SiO_2$, SiO, SiN, $TiO_2$, an isolating oxide, an isolating Nitride, an isolating Fluoride, a polymer, a non-conducting glue, a photo resist, a lacquer, an ink, a paint or a layer of glass, made of re-melted glass frit or combinations thereof. The isolation layer may be deposited between the segmented substrate electrodes as a first part of the segmented OLED elements with any suitable method, for example with dry physical processes such as evaporation or sputtering applying a suitable mask. Preferably the first isolation layer is deposited with print or spray processes without the need of a vacuum chamber reducing the coating effort. Therefore, the application of the isolation layer can be done easily and economically. Each of the named materials ensures that the isolation layer is non-conductive and does not harm the organic electroluminescent layer. Furthermore, it is preferable that the isolation glue of the isolation layer is anhydrous and/or water free. People skilled in the art may choose other materials within the scope of the present invention.

In a preferred embodiment the non-conducting material further comprises light scattering particles. The non-conducting material, e.g. a glue, comprises an organic or an inorganic material, preferably an organic matrix and an inorganic filler as the scattering particles. To achieve a lasting non-conducting material, e.g. a glue, at least one of the following matrices may be used: epoxys, polyurethanes, acrylics or silicones. If an inorganic filler is used the following materials have shown to be preferable: inorganic pigments like $SiO_2$, $TiO_2$, $ZnO_2$, $BaSO_4$, ZnS. By combining the named matrices and one or more of the named fillers a stable, durable non-conductive materials for isolating means is achieved. This non-conducting material for at least the first isolation layer combines the advantages of being water free, non-damaging the electrodes and/or organic electroluminescent layer and preventing shorts between adjacent substrate electrodes and/or substrate and counter electrode of each OLED segment and redirects light from the substrate towards the environment.

In another embodiment the amount, size and/or material of the light scattering particles are adapted to provide a luminance of the interconnect region of at least 25%, preferably of at least 50%, more preferred of at least 75%, most preferred of at least 90%, of the luminance of the OLED segments. The increased luminance of the interconnect regions due to an enhanced light scattering leads to a homogeneous brightness appearance of the OLED device. Therefore the interconnect region can be wider, enabling less complex coating processes compared to the case, where very small interconnect regions shall be prepared.

In another embodiment the width of the first isolation layer parallel to the substrate is at least 0.1 mm, preferably at least 0.5 mm more preferred between 0.5 mm and 1.0 mm. The notation width denotes any kind of extension of the first isolation layer parallel to the substrate between the adjacent substrate electrodes. The width in this sense is the width of the first isolation layer projected on the substrate surface. A minimum width of 0.1 mm is required to obtain a reliable isolation between adjacent substrate electrodes. If the gap between adjacent electrodes to be filled with the isolation layer is larger, less complex coating processes can be applied such as printing and/or spraying processes. Additionally the same coating process can be performed more reliable with a larger width of the first isolation layer. However, the larger the width of the first isolation layer the more difficult is to achieve a homogeneous brightness of the OLED device. A large width of the isolation layer will increase the interconnect region. To keep the invisibility or at least the less visibility of the interconnect region, the redirection of light, preferably the scattering of light, has to be enhanced. Therefore, the width of the isolation layer should not be too large, preferably not larger than 1.0 mm, to provide an OLED device with at least reduced appearance of regions with reduced brightness (interconnect regions), preferably OLED devices with homogeneous brightness. An isolation layer comprising scattering particles allow a larger width of the isolation layer.

In another embodiment the interconnect region further comprises a second isolation layer of the non-conducting material on top of the substrate electrode to define an interconnect area between first and second isolation layers to be coated with the conductive layer, preferably of a non-conducting material having a material property preventing the emergence of a shadowing edge on the substrate electrode. A shadowing edge shields parts of the to-be-coated area (here the substrate electrode) against material deposition from a process with directed deposition, e.g. vacuum evaporation, where the materials to be deposited follow a straight path from the material source to the substrate. In some embodiments the non-conducting material of first and second isolation layer is the same material. In alternative embodiments the non-conducting materials of first and second isolation layer is different. The second isolation layer enables a coating process for the layer stack using the same mask. Depending on the deposition process, the notation same mask may denote in case of multiple masks the possibility to use identical masks or alternatively the possibility to use one single mask to deposit the remaining layers of the OLED layer stack on top of the substrate electrode. With the same mask, both organic and counter electrode layers end on top of the second isolation layer. Even in case of a not perfectly defined edge of the counter electrode, the risk to have an accidental short between counter and substrate electrode is prevented by this second isolation layer with a width parallel to the substrate surface of more than 0.1 mm. Current mask technology will provide uncertainties below this limit. However, in a preferred embodiment the width of the second isolation layer parallel to the substrate is at least 0.1 mm, preferably at least 0.5 mm more preferred between 0.5 mm and 1.0 mm. The notation width denotes any kind of extension of the second isolation layer parallel to the substrate between the adjacent substrate electrodes. The width in this sense is the width of the second isolation layer projected on the substrate surface. The larger the width, the less sensitive is the coating process on the quality (e.g. frayed edges) of the edge of the counter electrode. With a large width, the risk of having a short between counter and substrate electrode is prevented even in case of very frazzling edges of the counter electrode and/or in case of misalignments of the same mask compared to the previous deposition of the organic layers.

It is preferable that both first and second isolation layers have shapes with smooth and/or continuous and/or non-steep edges and/or hill-like shape achieved by suitable material properties and application procedures of these layers preventing the emergence of a shadowing edge. A shadowing edge shields parts of the to-be-coated area (here the substrate electrode) against material deposition from a process with directed deposition, e.g. vacuum evaporation, where the materials to be deposited follow a straight path from the material source to the substrate. In a preferred embodiment one material property preventing the emergence of a shadowing edge is low viscosity, e.g. low viscosity at enhanced temperature. As an example a non-conductive glue may be applied onto the substrate electrode. If this non-conductive glue comprises a viscosity that enables it to flow, a smooth shape of the isolation layer will result, which prevents shadowing effects. If a material is used for a isolation layer that gives rise to steep edges that may create shadowing effects if only one deposition source is used, several deposition sources could be used to deposit material from different directions onto the substrate. It may also be advisable to rotate or otherwise move the substrate during deposition to ensure a continuous layer deposition over the first and second isolation layer.

Furthermore the presence of the second isolation layer enables the application of cutting and lift-off processes on top of the first and second isolation layers in order to structure the interconnect region, because the non-conducting material as specified is rigid enough to protect the substrate electrode from any influence of the counter electrode and/or the cutting process applied to the counter electrode. As one example, laser cutting of a layer stack prepared on top of the second isolation layer is possible without damaging the counter electrode and/or without creating any shorts between counter and substrate electrodes of one OLED segment. The required thickness of the second isolation layer depends on the cutting method, but typically more than 1 μm, preferably more than 10 μm, most preferably more than 25 μm are used.

The same cutting and lift-off processes may be applied to the first isolation layer. In this case, the risk of occurring shorts is very low, because the first isolation layer is commonly prepared on top of the substrate with no substrate electrode below. In case of alternative embodiments with a substrate electrode below the first isolation layer, the thickness of the first isolation layer should be large enough to prevent any short between substrate and counter electrode of one OLED segment as the result of a damage of the first isolation layer during the cutting process. The required thickness of the second isolation layer depends on the cutting method, but typically more than 1 μm, preferably more than 10 μm, most preferably more than 25 μm are used.

In another embodiment the width of the interconnect area is at least 0.1 mm, preferably at least 0.5 mm more preferred between 0.5 mm and 1.0 mm. This width of the interconnect area enables a simple and/or more reliable coating process to deposit the conductive layer within the interconnect region in order to obtain an electrically conducting connection between the counter electrode of one OLED segment to the substrate electrode of the adjacent OLED segment, for example printing and/or spraying processes. Furthermore any misalignment during the deposition processes of first and second isolation layer becomes less critical for the deposition of the conductive layer without creating any short to the counter electrode of the adjacent OLED segment with a width of the interconnect area of at least 0.1 mm between both isolation layers. A larger width of the interconnect area further decreases this risk. However this width should not be larger than 1.0 mm in order to keep the interconnect region as invisible as possible (corresponding to keeping the brightness of interconnect region as close as possible to the brightness of the OLED segments). At a larger width of the interconnect area, the light redirection effect must be larger. As an example this can be achieved by first and second isolation layers and the conductive layer comprising scatting particle of suitable amount, size and optical properties to enhance the light scattering effect over the whole interconnect region. In alternative embodiment either the first or the second or the conductive layer may comprise scattering particle or combinations thereof such as first and second isolation layer comprising scattering particle and the conductive layer does not comprise scattering particles or the conductive layer comprises scattering particles together and neither the first nor the second isolation layer comprise scattering particles or all layers comprise scattering particles. In all those possible combinations, additionally the amount, size and kind of scattering particles can be equal or adjusted differently.

It is preferable that both first and second isolation layers have smooth and non-steep edges achieved by suitable material properties and application procedures of these layers that prevents the emergence of a shadowing edge on a substrate electrode. In a preferred embodiment one material property preventing the emergence of a one shadowing edge is low viscosity, e.g. low viscosity at enhanced temperature. As an example hill-like shape of the isolation layer will result preventing shadowing effects. If a material is used for the isolation layers that gives rise to steep edges that may create shadowing effects if only one deposition source is used, several deposition sources could be used to deposit material from different directions onto the substrate. It may also be advisable to rotate or otherwise move the substrate during deposition to ensure a continuous layer deposition over the isolation layer.

This invention further relates to a method to provide an OLED device according to claim 1 comprising the steps
  preparing multiple segments of substrate electrodes on top of a substrate,
  depositing first isolating layers between the multiple segments of substrate electrodes to prevent electrical contact between adjacent substrate electrodes, and
  finishing the OLED device The step of preparing comprises the deposition of the substrate electrode on top of the substrate and the structuring of the substrate electrode into segments of substrate electrode, on which the remaining layers of the OLED segment will be deposited. The deposition and structuring of the substrate electrode may be combined in one deposition step applying a suitable mask to obtain the desired substrate electrode segments. As an example substrate electrodes made of ITO are commonly deposited by sputtering, where the application of mask for structuring the deposited layers is quite usual. Alternatively, structuring by photolithography or laser cutting may be employed. The depositing step of the first isolation layer may be executed with any suitable process, preferably easy and sufficiently reliable printing and/or spraying processes providing a higher deposition rate leading to short process times. The advantage to deposit the first isolation layer before depositing the organic layers is the freedom to apply higher temperatures during or after the deposition process of the first isolation layer. The deposition process of the first isolation layer may comprise a sinter process, e.g. after applying glass frit as the non-conducting material in the gaps between the substrate electrode segments. The notation finishing the OLED devices comprises all suitable deposition processes and the deposition of all suitable layers required to obtain an OLED device according to the present invention.

In another embodiment of the method the step of finishing the OLED device further comprises the step of depositing a second isolation layer on top of the substrate electrode to define an interconnect area between the first and second isolation layers within the interconnect region of each OLED segment. The second isolation layer has to be deposited before depositing the remaining layers of the OLED segment, because this enables on one hand the application of any high temperature deposition process such as sintering if desired and on the other hand it enables a reduction of the number of required masks to structure the layers to be deposited, for example to use the same mask for depositing the remaining layers of the OLED segments. Alternatively printing and/or spraying processes might be used to deposit the second isolation layer on top of the substrate electrode providing a higher deposition rate leading to short process times. The depositing of the second isolation layer further enables the later application of cutting and lift-off processes to the interconnect region without damaging the OLED device.

In a preferred embodiment the step of depositing of the second isolation layer further comprises an adjusting of at least one process parameter in order to achieve a shape of the second isolation layer preventing shadowing edges, preferably the temperature. A preferred deposition technology for depositing the organic layers and the counter electrode is vacuum evaporation, where the materials to be deposited follow a straight path from the evaporation source to the substrate leading to a directed deposition. If the second isolation layer, or both isolation layers, has steep edges, shadowing effects will occur, leading to holes in the organic layers and the counter electrode. At enhanced temperature, the viscosity of the non-conducting material is decreased leading to such a shape with smooth and/or continuous and/or non-steep edges and/or a hill-like shape. A low viscosity prevents the emergence of a one shadowing edge. For materials having a sufficiently low viscosity at room temperature, the process temperature may be room temperature.

In another embodiment the step of finishing the OLED device after depositing the second isolation layer further comprises the steps
depositing the electroluminescent layer stack and on top of the electroluminescent layer stack the counter electrode with the same mask process shielding at least the interconnect area within the interconnect region, and
depositing the conductive layer covering the interconnect area and the first isolation layer at least partially, preferably fully, in order to connect the counter electrode of the OLED segment to the substrate electrode of the adjacent OLED segment.

Depending on the deposition process, the notation same mask may denote in case of multiple masks the possibility to use identical masks or alternatively the possibility to use one single mask to deposit the remaining layers of the OLED layer stack on top of the substrate electrode. With the same mask, both organic and counter electrode layers end on top of the second isolation layer. Even in case of a not perfectly defined edge of the counter electrode, the risk to have an accidental short between counter and substrate electrode is prevented by this second isolation layer with a width parallel to the substrate surface of more than 0.1 mm. Current mask technology will provide uncertainties below this limit. However, in a preferred embodiment the width of the second isolation layer parallel to the substrate is at least 0.1 mm, preferably at least 0.5 mm more preferred between 0.5 mm and 1.0 mm. The conductive layer may be deposited by evaporating or sputtering processes. Preferably, the conductive layer is deposited by print or spray processes providing a higher deposition rate leading to short process times.

In an alternative embodiment the step of finishing the OLED device after depositing the second isolation layer further comprises the steps
depositing the electroluminescent layer stack and on top of the electroluminescent layer stack the counter electrode without shielding the interconnect regions
cutting the electroluminescent layer stack and the counter electrode on top of the first and second isolation layers, preferably applying laser cutting or mechanical cutting,
lifting off the electroluminescent layer stack and the counter electrode between first and second isolation layer
depositing the conductive layer covering the interconnect area and the first isolation layer at least partially, preferably fully in order to connect the counter electrode of the OLED segment to the substrate electrode of the adjacent OLED segment.

The advantage of this alternative embodiment is the absence of any mask to structure the OLED segments. All remaining layers to be deposited on top of the substrate electrodes and the first and second isolation layers are deposited as one single layer covering the whole OLED device. The whole OLED device shall be understood to denote the functional area, which is the light emitting area. The OLED regions outside the functional area may still require structuring, e.g. for providing connection to a power source and/or for encapsulating the OLED device with a cover lid or equivalent encapsulations such as thin film encapsulations. To establishing an electrical connection between counter electrode of one OLED segment to the substrate electrode of the adjacent OLED segment the layer stack covering the interconnect region has to be removed. To avoid any misunderstanding the first and second isolating layers as well as the substrate electrode are not part of said layer stack to be removed. The removal is executed in two steps, first cutting the deposited layer stack on top of the isolation layers, which are rigid enough not to be damaged. The notation damage denotes the destruction of the functionality of a layer. It is acceptable, that parts of the layer might be modified during the cutting process, if the functionality of the layers is not changed. In this case, no damage means, that the isolation layers are still isolating after the cutting process. Isolation layers, which are hard and/or thick enough (material and process property as previously disclosed) enables cutting processes not affecting the functionality of the isolation layers. After the cutting, the layers within the interconnect region are separated from the corresponding layers as part of the OLED segments and can be removed by suitable processes. However it is preferred to perform the step of lifting off with an adhesive tool or a laser applying a laser ablation process in order to lower the risk of damaging the layer stack within the OLED segments.

In case of a previous lifting-off process the step of depositing of the conductive layer is performed in another embodiment with a conducting material according to claim 2 in order provide an sufficient electrical contact between substrate electrode and the counter electrode of the adjacent OLED segment. During the lift-off process some parts of the electroluminescent layer may remain attached to the substrate electrode within the interconnect area of the interconnect region. Electrically conducting materials such as glue, lacquer or ink comprising particles, preferably conducting light scattering particles, make a reliable contact even in the case of present organic material, since it dissolve the remaining organic material of the lifted-off electroluminescent layer stack slightly and since in the drying process of the conductive layer, the conducting particles are forced into the substrate electrode surface establishing a reliable electrical contact between the conductive layer and the substrate electrode.

The aforementioned OLED device and/or method, as well as claimed components to be used in accordance with the invention in the described embodiments are not subject to any special exceptions with respect to size, shape, material selection. Technical concepts such as the selection criteria are known in pertinent field can be applied without limitations. Additional details, characteristics and advantages of the object of the present invention are disclosed in the dependent claims and the following description of the respective figures—which are an exemplary fashion only—showing the plurality of preferred embodiments of the OLED device according to the present invention.

BRIEF DESCRIPTION OF THE DRAWINGS

Further embodiments of the invention will be described with respect to the following figures, which show.

DETAILED DESCRIPTION OF EMBODIMENTS

Figure 1:
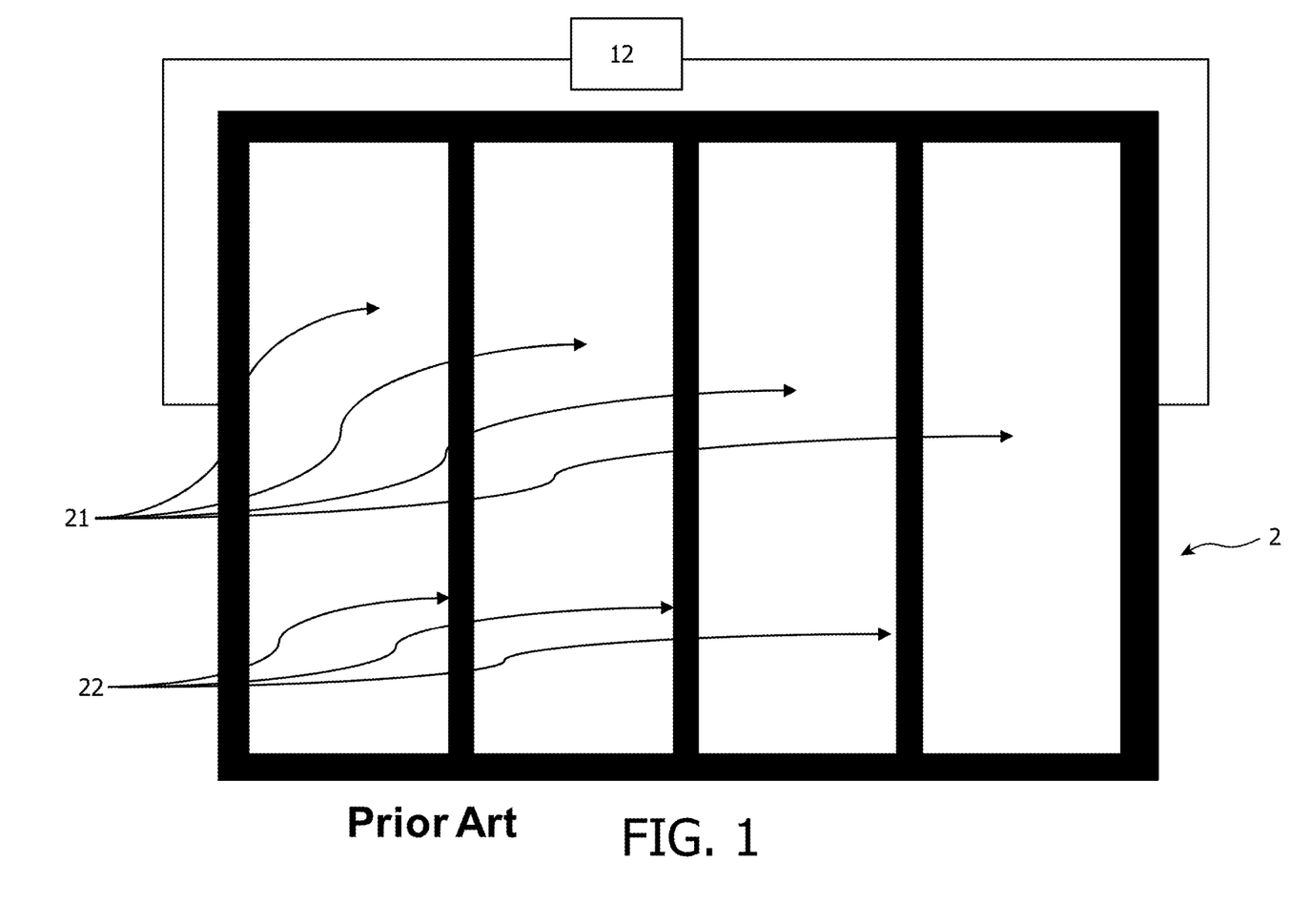
FIG. 1: OLED device with OLED segments connected in series according to prior art as a top view on the light emitting substrate.

FIG. 1 shows an OLED device 2 according to prior art in a top view with a driver 12 to operate the OLED device 2 with OLED segments 21 emitting light (indicated as white areas) connected in series showing black lines in the interconnect regions 22 between the OLED segments, where no light is emitted from the electroluminescent layers. The driver 12 is connected to one of the electrodes of the first of the OLED segment connected in series and to the other electrode of the last of the OLED segments connected in series in order to apply an operating voltage (or operating current) to the OLED device in order to receive light emission from the electroluminescent layer stack. This operating voltage (or current) may be constant or alternating and/or may be adjustable, e.g. to vary the average value, peak value of the voltage or current or its alternating frequency or any other suitable driving parameters. Driver and driving schemes also apply for the present invention.

Figure 2:
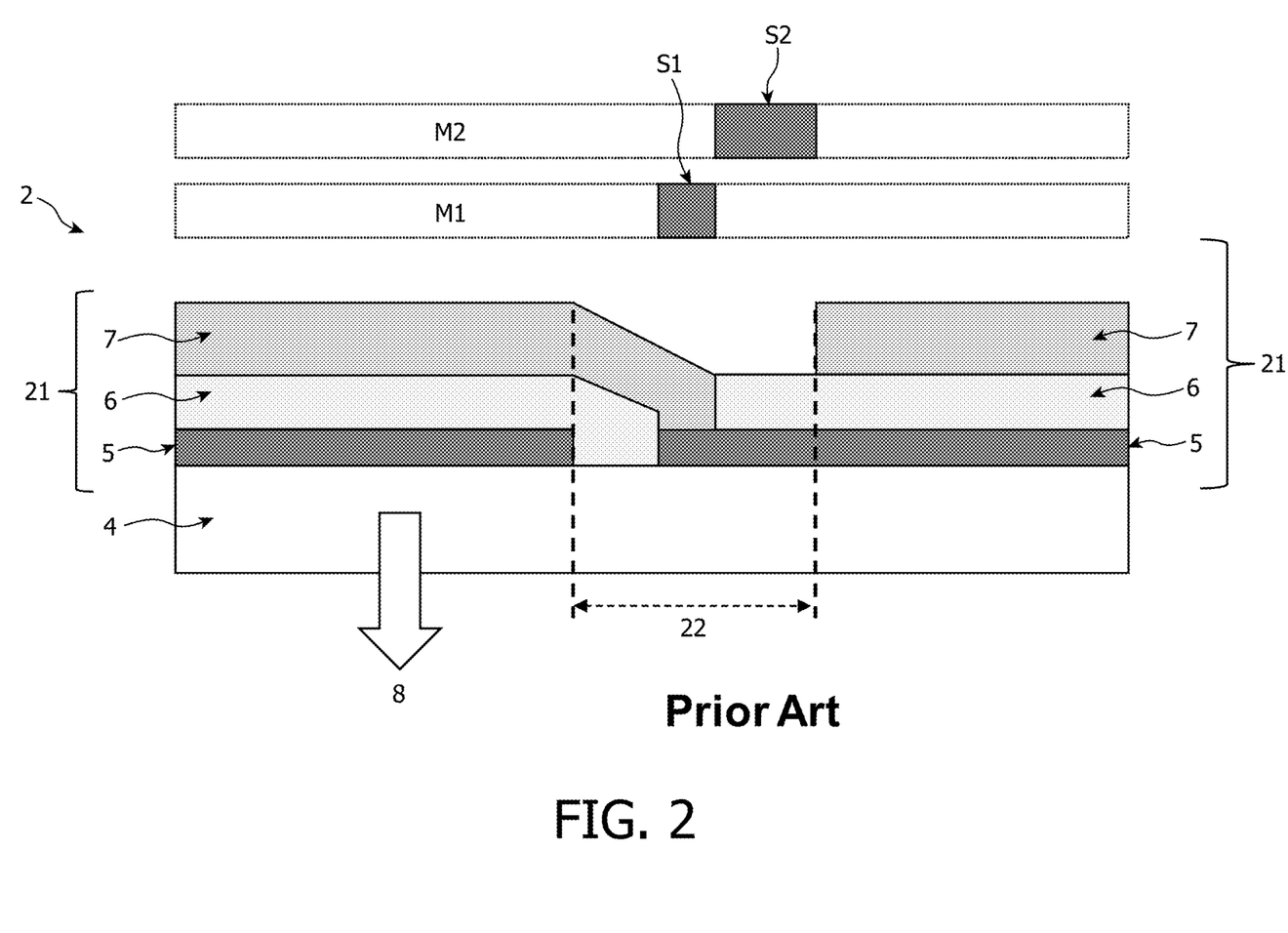
FIG. 2: cross section of an OLED device according to prior art as shown in FIG. 1.

FIG. 2 shows the OLED device of FIG. 1 in a side view. The OLED device 2 according to prior art comprises a substrate 4, a substrate electrode 5, an electroluminescent layer (or layer stack) 6 and a counter electrode 7 forming OLED segments 21 connected in series. The series connection is achieved in an interconnect region 22 indicated by the dashed arrow via the electroluminescent layer 6 prepared in a first deposition process applying a first mask M1 shielding a first part S1 of the interconnect region 22 to extend the electroluminescent layer 6 into the gap between adjacent substrate electrode elements 5 in order to insulated adjacent substrate electrodes 5 from each other. The shielding part S1 prevents material deposition onto the substrate electrode 5 in a short area between adjacent deposited electroluminescent layer stack segments 6. In a subsequent second deposition process, the counter electrode 7 is prepared applying a second mask M2 shielding a second part S2 of the interconnect region 22 different to the first part S1 in position and/or extension. The different shielding part S2 enables a deposition of the counter electrode 7 extending to the substrate electrode 5 of the adjacent OLED segment 21 in order to provide multiple OLED segments 21 electrically connected in series. The counter electrode present in the interconnect region 22 is the electrically connecting bridge between adjacent OLED segments 21. The second shielded part S2 is required to prevent any shorts between adjacent counter electrodes 7 of adjacent OLED segments 21. The deposition process of OLED devices according to prior art requires two different masks carefully aligned to each other and to the substrate making the prior art process complex, less reliable and thus expensive. Additionally the interconnect region is not able to redirect light out of the substrate, at least no light emission occurs from the shielded parts S1 and S2 of the interconnect region 22. The contribution of the gap between the segmented substrate electrodes 5 to the total light emission 8 is negligible.

Figure 3:
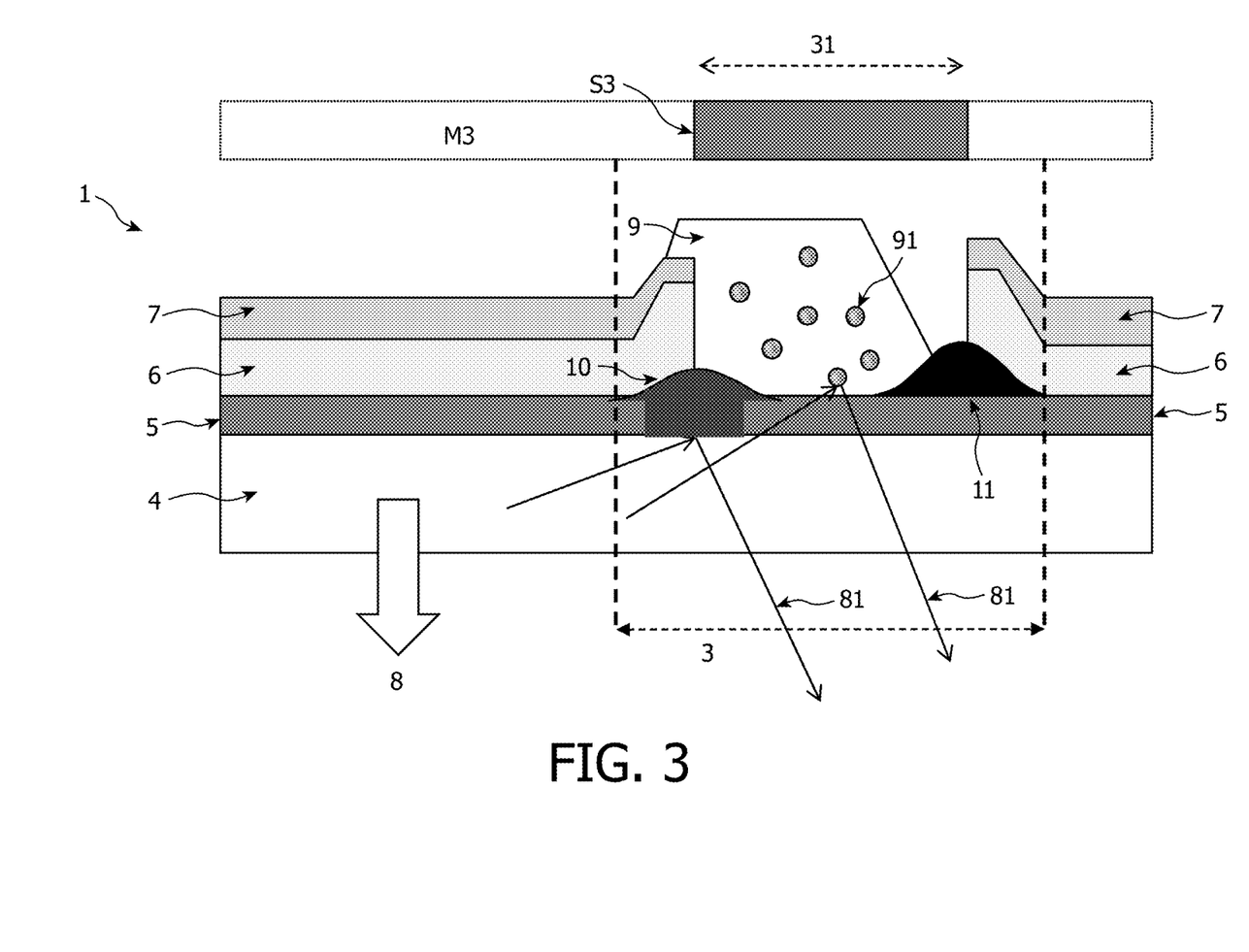
FIG. 3: cross section of an OLED device according to the present invention prepared with a one-mask process.
Figure 4:
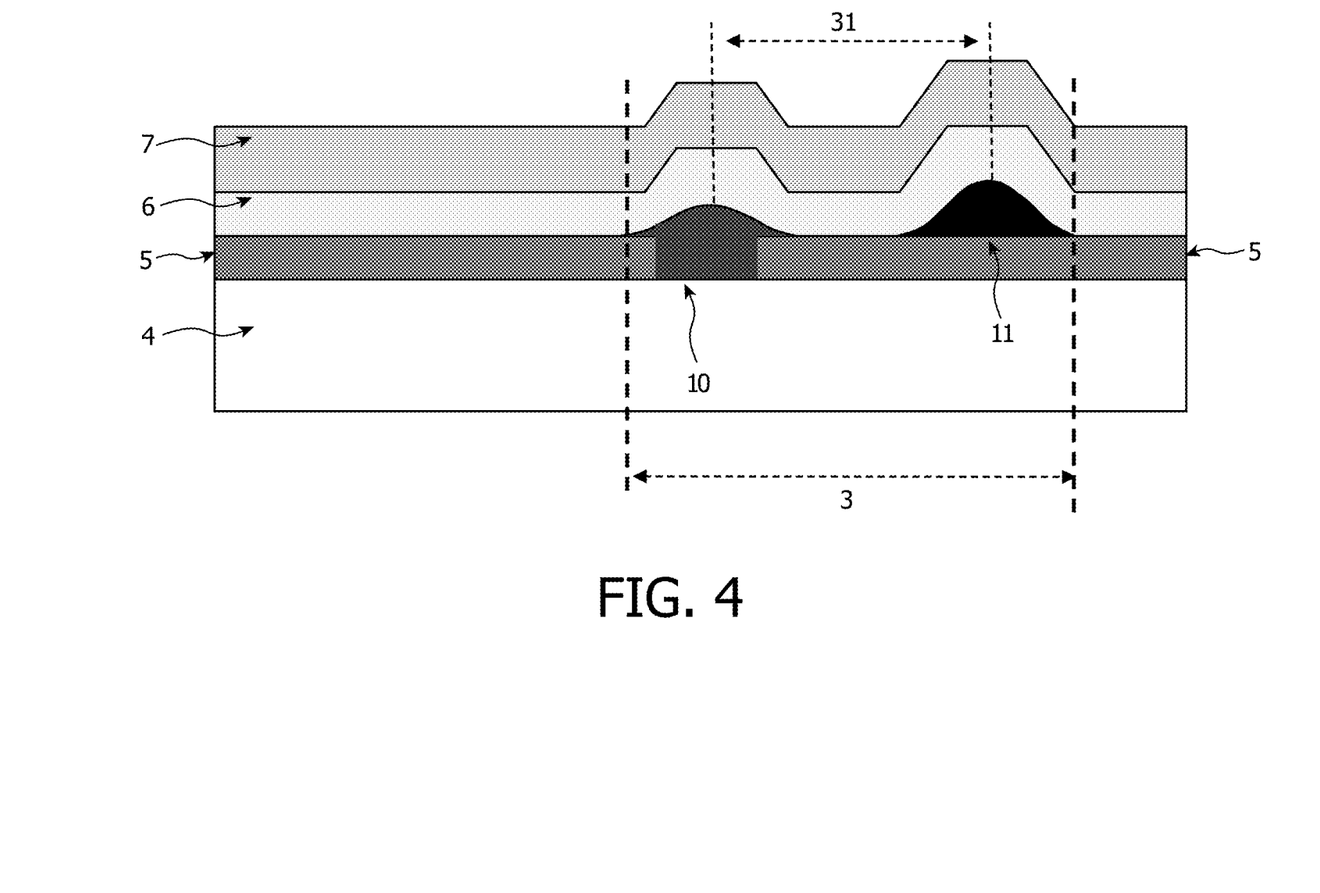
FIG. 4: cross section of an OLED device according to the present invention prepared with a lift-off process before lifting off the layers within the interconnect region.
Figure 5:
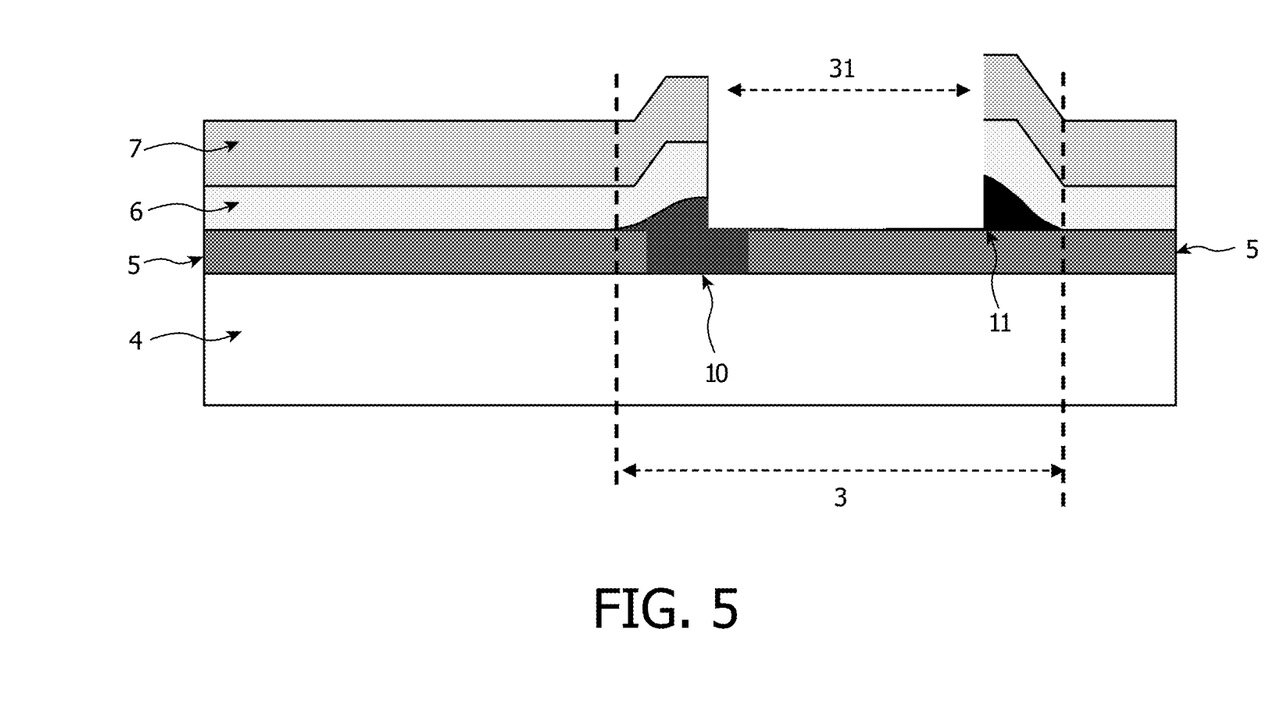
FIG. 5: cross section of an OLED device according to the present invention prepared with a lift-off process after lifting off the layers within the interconnect region and before depositing the conductive layer.

FIG. 3 shows an OLED device according to the present invention, where the interconnect region redirects a significant part of light trapped within the substrate towards the substrate surface with an angle of incidence suitable to be coupled out to the environment. The shown OLED device 1 comprises a substrate 4 and OLED segments comprising a substrate electrode 5, an electroluminescent layer stack 6 (here shown as one electroluminescent layer) and a counter electrode 7. The substrate electrodes 5 of adjacent OLED segments are electrically isolated from each other by a first isolation layer 10 deposited in the gap between the adjacent substrate electrodes. If materials such as glue, ink, lacquer, paint, photo resist, polymers are used to form the first isolation layer, this layer may extend over the edges of the adjacent substrate electrodes forming a smooth hill like shape with non-steep edges as shown in FIGS. 3 to 5. Such a shape is a preferred shape avoiding shadowing edges leading to shadowing effects during the deposition of the remaining layers on top of the first isolation layer, especially the electroluminescent layer stack and the counter electrode can be prepared without cracks, voids or other defects in the area around the isolation layer. If a second isolation layer 11 is prepared within the interconnect region 3 on top of the substrate electrode 5 to form an interconnect area 31 smaller than the interconnect region 3, the remaining layers on top of the substrate electrodes and first isolation layers can be prepared with the same shadow mask M3 shielding the interconnect area 31. Both, electroluminescent layer stack 6 (here one EL layer) and counter electrode 7 are deposited with the same mask M3 leading to essentially the same outer edges of both layers both located on top of the second isolation layer. Even small irregularities of the layer edges will not cause any shorts to the substrate electrode 5, because the second isolation layer 11 prevents any electrical contact between counter and substrate electrodes 5 and 7 of the same OLED segment. The one-mask-process for an OLED device according to this invention is a more simple production process of an OLED device compared to prior art and thus less expensive. To electrically connect the counter electrode 7 of one OLED segment to the substrate electrode 5 of the adjacent OLED segment, a conductive layer 9 comprising scattering particles 91 is applied within the interconnect area 31 of the interconnect region 3. The conductive layer 9 both establishes a serial connection between the OLED segments and redirect light 81 trapped within the substrate 4 towards the substrate surface in order to provide light emission from the interconnect regions 3. In a front view of an OLED device 1 no black lines appear. The brightness of the interconnect regions can be adapted by choosing suitable scattering materials (reflectivity, refractive index) added to the conductive layer as particles and/or flakes, suitable amount and size of such particles and/or flakes. To further enhance the scattering effect, also the first and second isolation layer 10 and 11 may comprise scattering particles of a suitable amount, size and material. People skilled in the art are able to select suitable particle and/or flake concentration and their corresponding sizes in order to adapt the brightness of the interconnect region top the desired value, preferably to a brightness equal to the brightness of an OLED segment.

FIG. 4 shows an intermediate step during the production process of an OLED device according to the present invention. If a second isolation layer 11 is prepared on top of the substrate electrode 5 within the interconnect region 3 to form an interconnect area 31, the production process of serially connected OLED segments can be performed even without a mask shielding the interconnect region 3 and/or the interconnect area 31. In this case, the complete active area of the OLED device is covered by one contiguous electroluminescent layer stack 6 and on top of it by a contiguous counter electrode 7. As shown in FIG. 5 the OLED segments are formed by a lift-off process of the layers 6 and 7 deposited within the interconnect area 31 after separating these layers from the layers covering the OLED segments 5, 6, 7. The separation can be achieved by cutting the layers on top of the first and second isolation layers 10 and 11. The cutting process may be by a mechanical tool (e.g. a scalpel) or by a laser cutting process. These processes can be computer controlled and therefore are reproducible, fast and cheap. The first and second isolation layers 10 and 11 must have properties that on the one hand ensure that it is electrically not conductive. Furthermore, first and second isolation layers 10 and 11 must be thick and hard enough to shield the substrate electrode from the cutting process. The precise thickness and hardness depend on the actual parameter (e.g. pressure, temperature) exerted by the cutting process, but typically thicknesses of 1-100 micron are sufficient. The desired protection has been achieved with isolation layers of non-conductive glue of 10-200 micrometer thickness, but thicker layers can also be used. The same holds for re-melted glass. Furthermore, it must be ensured that the isolation layers 10 and 11 do not damage either the substrate electrode, the organic electroluminescent layer or the counter electrode. In preferred embodiment the first and/or second isolation layers 10 and 11 comprise non-conductive glue. Furthermore, it is preferable that the non-conductive glue of the isolation layers is anhydrous and/or water free. The separated layers within the interconnect region can be removed by a lift-off process using an adhesive tool, for example an adhesive tape, or by a laser ablation process. In the latter case the layers to be removed do not have to be separated from the layers of the OLED segments before applying the laser ablation process.

In an experiment, the first and second isolation layers were made of a two-component epoxy glue (UHU plus schnellfest, curing time 5 min). The binder and the hardener were mixed in the prescribed ratio of 1:1 and then applied at room temperature to the ITO-covered glass substrate in between the substrate electrode elements and onto the substrate electrode. Then the substrate was heated on a hot plate to 60° C. for 15 min, which allowed the glue first to flow into a smooth shape and then to solidify rapidly. The procedure was carried out in a glove box in dry Nitrogen atmosphere (less than 1 ppm of water). The substrate with the hardened first and second isolation layers was then introduced into a vacuum chamber and the electroluminescent layer stack and the counter electrode were deposited on top of the substrate electrode segments and the isolation layers, using the same deposition mask. As the conductive layers, conductive glue (Circuitsworks conductive epoxy CW2400 from Chemtronics Inc.) comprising Ag flakes as light scattering particles was applied with a brush to the interconnect regions. The finished device was then encapsulated with a glass cover lid. The cover was applied by UV curing glue. A getter for water was placed in the cavity formed by the substrate and the lid. After setting of all glues (appr. 1 hour), the OLED was reliably driven by connecting the plus lead of a power supply to the rim of the substrate where the substrate electrode was exposed and the minus lead to the rim of the substrate where the counter electrode was exposed. The organic layers and the counter electrode made of Aluminum covered the isolation layers without cracks or holes. The interconnect regions appeared dark at the isolation layers and bright at the region where the conductive glue was used In a second experiment, the binder of the glue was mixed with $TiO_2$ particles, leading to a white substance. The rest of the procedure followed exactly the description give above. After setting of all glues (appr. 1 hour), the OLED was reliably driven by connecting the plus lead of a power supply to the rim of the substrate where the substrate electrode was exposed and the minus lead to the rim of the substrate where the counter electrode was exposed. The organic layers and the counter electrode made of Aluminum covered the isolation layers without cracks or holes. There was now light emission from the whole of the interconnect region due to the scattering of the light guided in the substrate by the $TiO_2$ particles embedded in the glue and the Ag particles in the conductive glue.

The described embodiments comprise as an example an electroluminescent layer 6 within the layer stack. In alternative embodiments within the scope of this invention, the layer stack may comprise layer additional to layer 6 such as hole transport layers, hole blocking layers, electron transport layers, electron blocking layers, charge injection layers further conducting layers etc.

LIST OF NUMERALS

1 OLED device according to this invention
2 OLED device according to prior art
21 OLED segments
22 Interconnect regions according to prior art
M1 first mask to apply the electroluminescent layer stack acc. to prior art
M2 second mask to apply the electroluminescent layer stack acc. to prior art S1 shielded area due to first mask
S2 shielded area due to second mask
3 Interconnect region according to our invention
31 Interconnect area
4 substrate
5 substrate electrode
6 electroluminescent layer stack
7 counter electrode
8 light emitted from the OLED segments
81 light scattered out of the substrate from the interconnect region
9 conductive layer
91 light scattering particles
10 first isolation layer
11 second isolation layer
12 driver
M3 mask to be used for depositing the OLED device acc. to this invention
S3 shielded area due to M3

The invention claimed is:

1. An organic light-emitting diode (OLED) device comprising:
a substrate with multiple light emitting OLED segments on top of the substrate, wherein each of the OLED segments comprises an electroluminescent layer stack of at least one organic light-emitting layer disposed between a substrate electrode facing towards the substrate and a counter electrode,
wherein the OLED segments are connected in series and adjacent segments of the OLED segments are separated by an interconnect region located between the adjacent OLED segments,
wherein the interconnect region includes a first isolation layer of an electrically non-conducting material between the substrate electrodes of the adjacent OLED segments to electrically isolate the substrate electrodes, of the adjacent OLED segments, from each other and includes a conductive layer of an electrically conducting material to connect the counter electrode of one of the adjacent OLED segments to the substrate electrode of the other OLED segment of the adjacent OLED segments, and
wherein the electrically non-conducting material includes light scattering particles that are configured to redirect the light emitted by the adjacent OLED segments out of the substrate to enable light emission from the interconnect region.

2. The OLED device according to claim 1, wherein the electrically conducting material comprises at least one material selected from the group consisting of: glue, lacquer and ink, and wherein the non-conducting material comprises at least one material selected from the group consisting of a photo resist, glue, lacquer, ink, paint, polymer and re-melted glass frit.

3. The OLED device according to claim 1, wherein the conducting material includes light scattering elements comprising at least one of light scattering particles or light scattering flakes that are configured to redirect the light emitted by the adjacent OLED segments out of the substrate to enable the light emission from the interconnect region.

4. The OLED device according to claim 3, wherein at least one of the amount, size or material of the light scattering particles of the non-conducting material and of the light scattering elements are adapted to provide a luminance of the interconnect region of at least 25% of the luminance of the adjacent OLED segments.

5. The OLED device according to claim 3, wherein at least one of the amount, size or material of the light scattering particles of the non-conducting material and of the light scattering elements are adapted to provide a luminance of the interconnect region of at least 90% of the luminance the adjacent OLED segments.

6. The OLED device according to claim 1, wherein the width of the first isolation layer parallel to the substrate of the one of the adjacent OLED segments is at least 0.1 mm.

7. OLED device according to claim 1, wherein the interconnect region further comprises a second isolation layer of the non-conducting material on top of the substrate electrode of the other OLED segment of the adjacent OLED segments to define an interconnect area between the first isolation layer and the second isolation layer coated with the conductive layer.

8. OLED device according to claim 7, wherein the width of the second isolation layer parallel to the substrate of the other of the adjacent OLED segments is at least 0.1 mm.

9. OLED device according to claim 7, wherein the width of the interconnect area is at least 0.1 mm.

10. The OLED device according to claim 7, wherein the width of the second isolation layer parallel to the substrate of one of the adjacent OLED segments is between 0.5 mm and 1.0 mm.

11. The OLED device according to claim 7, wherein the width of the interconnect area is between 0.5 mm and 1.0 mm.

12. The OLED device according to claim 1, wherein the width of the first isolation layer parallel to the substrate of one of the adjacent OLED segments is between 0.5 mm and 1.0 mm.

13. An organic light-emitting diode (OLED) device comprising:
a substrate with multiple light emitting OLED segments on top of the substrate, wherein each of the OLED segments comprises an electroluminescent layer stack of at least one organic light-emitting layer disposed between a substrate electrode facing towards the substrate and a counter electrode,
wherein the OLED segments are connected in series, wherein adjacent segments of the OLED segments are separated by an interconnect region located between the adjacent OLED segments,
wherein the interconnect region includes a first isolation layer of an electrically non-conducting material between the substrate electrodes of the adjacent OLED segments to electrically isolate the substrate electrodes, of the adjacent OLED segments, from each other, includes a conductive layer of an electrically conducting material to connect the counter electrode of one of the adjacent OLED segments to the substrate electrode of the other OLED segment of the adjacent OLED segments, and includes an electrically non-conducting additional isolation layer on top of the substrate electrode of the other OLED segment of the adjacent OLED segments to define an interconnect area between the first isolation layer and the additional isolation layer coated with the conductive layer, and
wherein at least one of the electrically non-conducting material or the conducting material is configured to redirect the light emitted by the adjacent OLED segments out of the substrate to enable light emission from the interconnect region.

* * * * *